(12) United States Patent
Chong

(10) Patent No.: US 11,355,671 B2
(45) Date of Patent: Jun. 7, 2022

(54) RING-SHAPED LED LAMP, LAMP STRING, AND CONTROL CIRCUIT THEREOF

(71) Applicant: Tit Tsang Chong, Hong Kong (CN)

(72) Inventor: Tit Tsang Chong, Hong Kong (CN)

( * ) Notice: Subject to any disclaimer, the term of this patent is extended or adjusted under 35 U.S.C. 154(b) by 231 days.

(21) Appl. No.: 16/609,850

(22) PCT Filed: Sep. 13, 2017

(86) PCT No.: PCT/CN2017/101555
§ 371 (c)(1),
(2) Date: Oct. 31, 2019

(87) PCT Pub. No.: WO2019/051663
PCT Pub. Date: Mar. 21, 2019

(65) Prior Publication Data
US 2020/0075808 A1 Mar. 5, 2020

(51) Int. Cl.
*H01L 33/36* (2010.01)
*H01L 33/20* (2010.01)
*H05B 45/20* (2020.01)
*H05B 45/37* (2020.01)

(52) U.S. Cl.
CPC .......... *H01L 33/20* (2013.01); *H05B 45/20* (2020.01); *H05B 45/37* (2020.01)

(58) Field of Classification Search
CPC .. H01L 33/62; H01L 33/36–38; H01L 33/486
See application file for complete search history.

(56) References Cited

U.S. PATENT DOCUMENTS

2017/0365757 A1* 12/2017 Nishida ................. H01L 33/56

FOREIGN PATENT DOCUMENTS

| CN | 201764319 U | 3/2011 |
|---|---|---|
| CN | 102842573 A | 12/2012 |
| CN | 102917505 A | 2/2013 |
| CN | 205028918 U | 2/2016 |
| CN | 206332046 U | 7/2017 |
| KR | 20090096943 A | 9/2009 |

* cited by examiner

*Primary Examiner* — Suberr L Chi
(74) *Attorney, Agent, or Firm* — Vivacqua Crane PLLC

(57) ABSTRACT

A ring-shaped LED lamp, including at least three LED chips and at least three pins partially located within a package body. The LED chips are connected in series and have two terminal ends connected to form a closed loop, and the pins are led out from connections between the LED chips. A lamp string includes at least one group of lamps and electrically conductive wires connected to multiple lamps, and each group of lamps includes a plurality of the above-described ring-shaped lamps. Also provided is a control circuit applicable for the lamp string. The control circuit includes an input device, a microprocessor, an output circuit, and a lamp string interface connected to the output circuit. The microprocessor receives a signal from the input device, and sends an I/O signal or PWM signal to the output circuit to trigger a voltage level change of the lamp string interface.

20 Claims, 13 Drawing Sheets

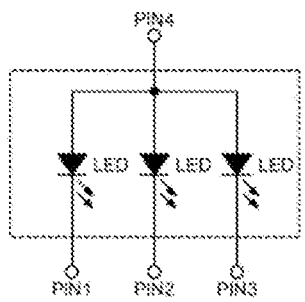
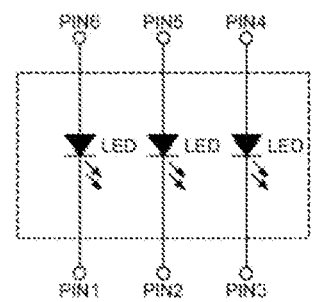
FIG.1a
(Prior Art)
FIG.1b
(Prior Art)
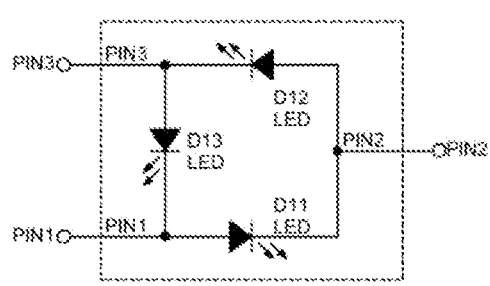
FIG.2
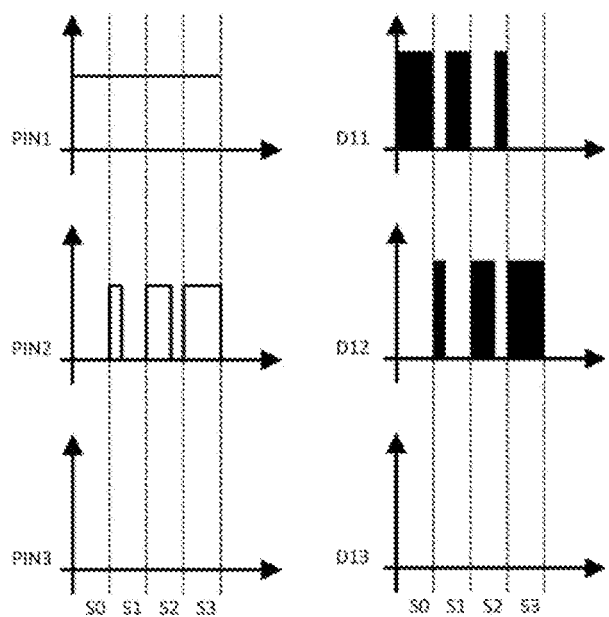
FIG.3a
FIG.3b

RING-SHAPED LED LAMP, LAMP STRING, AND CONTROL CIRCUIT THEREOF

CROSS-REFERENCE TO RELATED APPLICATIONS

This application is a national stage application under 35 U.S.C. 371 of PCT Application No. PCT/CN2017/101555 having an international filing date of 13 Sep. 2017, the entire disclosure of which is herein incorporated by reference.

FIELD

The present disclosure relates to the field of decorative illumination electronics, and in particular to a ring-shaped LED lamp, a lamp string including the lamp, and a control circuit and control method thereof.

BACKGROUND

Conventional LED lamps are generally classified into common-anode lamps (as shown in FIG. 1a), common-cathode lamps, and three-way lamps (shown in FIG. 1b). If these conventional LED lamps include three LED chips, then at least four pins are required and even six pins are required for power and control. These lamps can be connected in parallel to form a lamp string.

SUMMARY

To improve the existing lamps, according to an aspect of the present disclosure, a ring-shaped lamp for an LED chip connection line is provided, which can reduce the number of pins, save cost, and simplify wiring.

The ring-shaped lamp includes: a package body; three or more LED chips; electrically conductive pins partially located within the package body. The minimum number of the pins is the same as the number of LED chips, where in the package body, the LED chips are sequentially connected in a ring shape so that a P pole of each LED chip is simultaneously connected to an N pole of another LED chip and to one pin. In a preferred embodiment, the number of pins is the same as the number of LED chips.

For example, in some embodiments, the ring-shaped lamp includes n LED chips, thereby requiring n pins. In an embodiment, a P pole of a first LED chip is connected to a first pin, and an N pole of the n-th LED chip is connected to the first pin; a P pole of a second LED chip is connected to a second pin, and an N pole of the first LED chip is connected to the second pin; a P pole of a third LED chip is connected to a third pin, and an N pole of the second LED chip is connected to the third pin, . . . and so on. A P pole of the (n−1)-th LED chip is connected to the (n−1)-th pin, and an N pole of the (n−2)-th LED chip is connected to the (n−1)-th pin; moreover, a P pole of the n-th LED chip is connected to the n-th pin, and an N pole of the (n−1)-th LED chip is connected to the n-th pin.

Preferably, the number of the LED chips is three. Moreover, the P pole of the first LED chip is connected to the first pin by wire bonding or adhering a conductive adhesive, and the N pole of the third LED chip is connected to the first pin by wire bonding or the conductive adhesive. The P pole of the second LED chip is connected to the second pin by wire bonding or the conductive adhesive, and the N pole of the first LED chip is connected to the second pin by wire bonding or the conductive adhesive. Moreover, the P pole of the third LED chip is connected to the third pin by wire bonding or the conductive adhesive, and the N pole of the second LED chip is connected to the third pin by wire bonding or the conductive adhesive.

Further, the LED chip includes a bipolar LED chip and a unipolar LED chip, wherein one or more bipolar LED chips are adhered and fixed on the same pin, and/or one unipolar LED chip or two unipolar LED chips of different substrate polarities are adhered and fixed on the same pin by the conductive adhesive. In some embodiments, unipolar and bipolar LED chips can be simultaneously disposed on the same pin.

Further, the package mode for the package body can include DIP, SMD, SOT, or COB.

A control method of the lamp preferably includes: inputting a PWM signal to a pin, inputting a high level voltage to another pin, and inputting a low level voltage to other pins; or inputting a PWM signal to a pin, inputting a low level voltage to another pin, and inputting a high level voltage to other pins, so that at least two LED chips produce a visual effect of mixed light. More preferably, the PWM signal is a signal with a varying duty ratio.

According to another aspect of the present disclosure, it provides that a lamp string, including at least one group of lamps and electrically conductive wires connected to multiple lamps, where each group of lamps includes a plurality of the above-described ring-shaped lamps.

Further, pins of some or all of the ring-shaped lamps in each group of lamps are connected in parallel, with the parallel pins connected to one wire.

In an embodiment, the number of LED chips of each ring-shaped lamp is three, and the number of wires is three, where the first pins of all the lamps are connected to a first wire, the second pins of all the lamps are connected to a second wire, and the third pins of all the lamps are connected to a third wire.

In another embodiment, preferably, the lamp string at least includes a group of integrated ring-shaped lamps. In a group of integrated lamps, the number of ring-shaped lamps is two, and the number of LED chips of each ring-shaped lamp is three. When the number of wires of the lamp string is three, in each lamp group: a first pin of a first lamp and a third pin of a second lamp are connected to the first wire, respectively; second pins of the first lamp and the second lamp are connected to the second wire; and a third pin of the first lamp and a first pin of the second lamp are connected to the third wire, respectively.

In the embodiment, a control method of the lamp string includes: inputting a high level voltage to a wire, inputting a low level voltage to another wire, and setting other wires to a high-impedance state, so that one LED chip in a group of lamps is turned on; or inputting a high level voltage to a wire and inputting a low level voltage to other wires, or inputting a low level voltage to a wire and inputting a high level voltage to other wires, so that two LED chips in a group of lamps are turned on.

In another embodiment, preferably, the lamp string at least includes a group of integrated ring-shaped lamps. In a group of integrated lamps, the number of ring-shaped lamps is four, and the number of LED chips of each ring-shaped lamp is three. When the number of wires of the lamp string is four, in each lamp group: a first pin of a first lamp, a second pin of a third lamp, and a third pin of a fourth lamp are connected to the first wire; a second pin of the first lamp, a third pin of the second lamp, and a first pin of the third lamp are connected to the second wire; a third pin of the first lamp, a second pin of the second lamp, and a first pin of the fourth lamp are connected to the third wire; and a first pin of the second lamp, a third pin of the third lamp, and a second pin of the fourth lamp are connected to the fourth wire.

In the embodiment, a control method of the lamp string includes: inputting a high level voltage to a wire, inputting a low level voltage to another wire, and setting other wires to a high-impedance state, so that one LED chip in a group of lamps is turned on; or inputting a high level voltage to a wire and inputting a low level voltage to other wires, or inputting a low level voltage to a wire and inputting a high level voltage to other wires, so that three LED chips in a group of lamps are turned on, or inputting a high level voltage to two wires and inputting a low level voltage to other wires, so that four LED chips of in a group of lamps are turned on.

According to a third aspect of the present disclosure, it provides that a control circuit applicable for the lamp string. The control circuit includes an input device, a microprocessor, an output circuit, and a lamp string interface connected to the output circuit, where the microprocessor receives a signal from the input device, and sends an I/O signal or PWM signal to the output circuit to trigger a voltage level voltage change of the lamp string interface.

Further, the output circuit includes a transistor switching circuit, and/or a voltage follower circuit configured to regulate an output voltage of the transistor switching circuit.

Preferably, the output circuit includes a main switching circuit and a plurality of branch switching circuits, where the main switching circuit receives the I/O signal or PWM signal from the microprocessor to simultaneously control the plurality of branch switching circuits.

Further, the input device can include a touch key, a physical button, a microphone, a radio frequency receiver module, or an infrared receiver module.

According to the third aspect of the present disclosure, it provides that a lamp string system. The lamp string system includes the above-mentioned lamp string and a control circuit.

The present disclosure has the following beneficial effects.

Due to less pins, it further helps to reduce the volume of the LED lamp, save processing/soldering costs, increase production efficiency, and reduce the defective rate of lamp production. Moreover, only one group of PWM signals is required to enable two LED chips to produce a visual effect of mixed light.

Using the innovative ring-shaped LED lamps to form a lamp string line, and reasonably matching the bonding and pin configuration of the ring-shaped LED lamp can achieve copper line lamp/copper wire lamp/net lamp/curtain lamp/meteor lamp and other LED lamp string product applications, such as, colorful mixed light/synchronous flash/mixed light gradual change/wave flash/jump/sharp-flash/bounce flash/interactive flash/horse race flash/meteor flash/flash with the music. The ring-shaped LED lamp can be mass-produced at a lower cost and higher efficiency.

BRIEF DESCRIPTION OF THE DRAWINGS

The present disclosure will be explained below in more detail with reference to the accompanying drawings. In all the drawings, the same reference numerals indicate the same or equivalent features.

FIG. 1a is a schematic diagram of a common-anode LED lamp in the prior art;

FIG. 1b is a schematic diagram of a three-way LED lamp in the prior art;

FIG. 2 is a schematic diagram of a ring-shaped lamp according to an embodiment of the present disclosure;

FIG. 3a is a diagram showing level voltage of the pins of the lamp in FIG. 2;

FIG. 3b is a diagram showing changes in illumination of the lamp of FIG. 2 when the pins are electrified as shown in FIG. 3a;

DETAILED DESCRIPTION

Figure 4A:
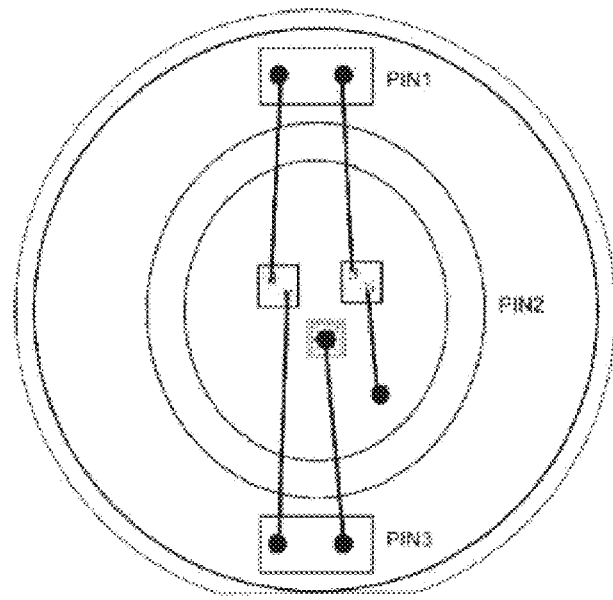
FIG. 4a and FIG. 4b are bonding diagrams of a ring-shaped lamp in DIP according to an embodiment of the present disclosure.

The concept, the specific structure and the technical effect of the present disclosure will be clearly and completely described in conjunction with embodiments and the accompanying drawings in order to fully understand the objectives, solutions, and effects of the present disclosure. It should be noted that the embodiments in the present application and the features in the embodiments can be combined with each other without conflict.

The terms used in the present disclosure are for the purpose of describing particular embodiments only, and are not intended to limit the present disclosure. The singular forms "a" and "the" used in the present disclosure and the appended claims are also intended to include plural form, unless the context clearly indicates other meanings. It should also be understood that the term "and/or" as used herein refers to and encompasses any and all possible combinations of one or more associated listed items. It should be understood that although the terms, first, second, third, etc. may be used to describe various components in the present disclosure, such information should not be limited to these terms. These terms are only used to distinguish the same type of information from each other. For example, a first component can also be called a second component without departing from the scope of the present disclosure. Similarly, a second component can also be called a first component.

In an embodiment of the present disclosure, at least three LED chips are connected in series and have two terminal ends connected to form a closed loop, and the pins are led out from connections between the LED chips. In this way, the LED chips are sequentially connected in a ring shape so that that a P pole of each LED chip is simultaneously connected to an N pole of another LED chip and to one pin.

For example, the ring-shaped lamp includes n LED chips, thereby requiring n pins. In this embodiment, a P pole of a first LED chip is connected to a first pin, and an N pole of the n-th LED chip is connected to the first pin. A P pole of a second LED chip is connected to a second pin, and an N pole of the first LED chip is connected to the second pin. A P pole of a third LED chip is connected to a third pin, and an N pole of the second LED chip is connected to the third pin, . . . and so on. A P pole of the (n−1)-th LED chip is connected to the (n−1)-th pin, and an N pole of the (n−2)-th LED chip is connected to the (n−1)-th pin. Moreover, a P pole of the n-th LED chip is connected to the n-th pin, and an N pole of the (n−1)-th LED chip is connected to the n-th pin.

The number of LED chips is preferably from 3 to 8 in consideration of the application and manufacturing conditions of the lamp. In the following embodiments the examples of the present disclosure with the solution of three LED chips are described. It should be understood that the technical solutions of other numbers of LED chips can be undoubtedly associated.

In the embodiment shown in FIG. 2, the number of LED chips is three. The P pole of the first chip D11 is connected to the first pin PIN1, and the N pole of the third chip D13 is connected to the first pin. The P pole of the second chip D12 is connected to the second pin PIN2, and the N pole of the first chip is connected to the second pin. Moreover, the P pole of the third chip is connected to the third pin PIN3, and the N pole of the second chip is connected to the third pin.

The ring-shaped LED lamp only requires three electrical pins, but has the equivalent effect of the conventional common-anode LED lamp (as shown in FIG. 1*a*, four electrical pins required), the conventional common-cathode LED lamp (four electrical pins required), and the conventional three-way LED lamp (as shown in FIG. 1*b*, six electrical pins required), which can be realized by the control method described below.

| Truth table T1 | | | |
|---|---|---|---|
| | LED | | |
| PIN | D11 | D12 | D13 |
| PIN1 | H | X | L |
| PIN2 | L | H | X |
| PIN3 | X | L | H |

H: high level voltage.
L: low level voltage.
X: any level voltage between the high level voltage and low level voltage.

The truth table T1 corresponds to the schematic diagram of the ring-shaped LED lamp shown in FIG. 2 of the present disclosure. The visual effect that D11, D12, and D13 are turned on together can be achieved when the states of D11, D12, and D13 are respectively turned on and rapidly cycled.

| Truth table T2 | | | |
|---|---|---|---|
| | LED | | |
| PIN | D11&D12 | D12&D13 | D13&D11 |
| PIN1 | H | L | PWM |
| PIN2 | PWM | H | L |
| PIN3 | L | PWM | H |

H: high level voltage.
L: low level voltage.
PWM: High-level voltage or low-level voltage pulse-width modulation (PWM) signal The truth table T2 corresponds to the schematic diagram of the ring-shaped LED lamp shown in FIG. 2 of the present disclosure. Only one group of PWM signals is required, so that two LED chips can produce a visual effect of mixed light.

For example, referring to the "D11 & D12" field of truth table T2, as shown in FIG. 3*a*, H high level voltage signal is input to PIN1, L low level voltage signal is input to PIN3, and a ™1 high level voltage signal with the duty ratio gradually increased is input to PIN2. It can be obtained that the illuminating time of the LED chip D11 gradually decreases with the period S0 to S3, and the illuminating time of the LED chip D12 gradually increases with the period S0 to S3, as shown in FIG. 3*b*, so as to produce a visual effect of mixed light gradual change between the LED chips D11 and D12.

The PWM high/low level voltage signal can be adjusted according to actual needs, so that corresponding two LED chips can obtain different visual effects of mixed light.

In an embodiment of the present disclosure, the LED chips are classified into bipolar and unipolar, and wherein the unipolar is further classified into positive polarity and reverse polarity. The unipolar LED chip is generally a chip emitting red light, yellow light or orange light, and its position on the PIN of an LED bracket can be adjusted according to the actual application. Preferably, each pole of the bipolar LED chip or the non-substrate pole of the unipolar LED chip can be connected to the electrically conductive pin by wire bonding, and the substrate of the unipolar LED chip can be connected to the electrically conductive pin by conductive adhesive.

FIG. 4*a* is a bonding diagram (or a top view) of a DIP ring-shaped LED encapsulated lamp. The unipolar LED chip on the LED bracket PIN2 has positive polarity, and the substrate thereof is N pole and is connected to the LED bracket PIN2 by using the conductive adhesive. In another embodiment not shown in the drawing, the unipolar LED chip on the LED bracket PIN2 can also have reverse polarity, and the substrate thereof is a P pole and is connected to the LED bracket PIN2 by using the conductive adhesive, and the N pole thereof is connected to the P poles of other LED chips.

Figure 4B:
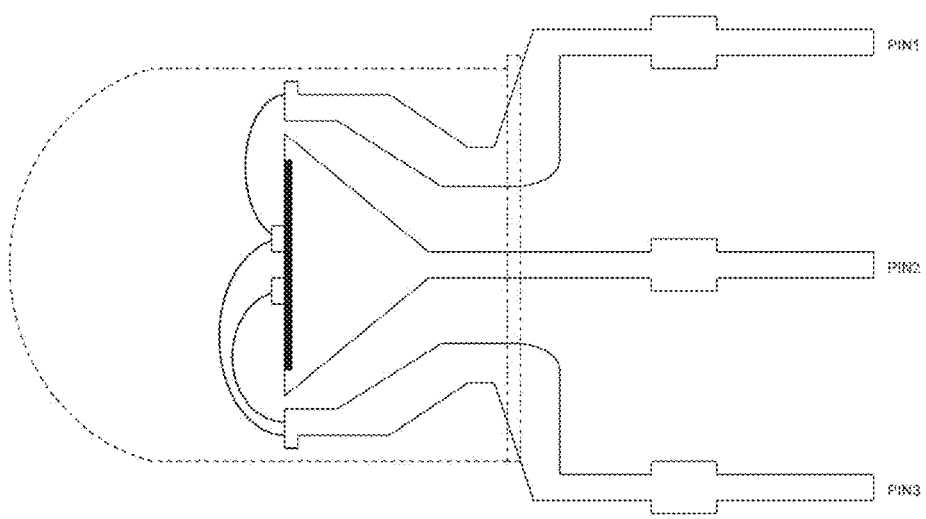

FIG. 4*b* is an appearance side view of the DTP ring-shaped LED lamp of FIG. 4*a*. In the side view, an LED lamp with a bullet (round) shape is used as an example. The actual in-line LED lamps also have various shapes such as flattop, concave, straw hat, ellipse, and square, all of which are equivalent changes.

Figure 5A:
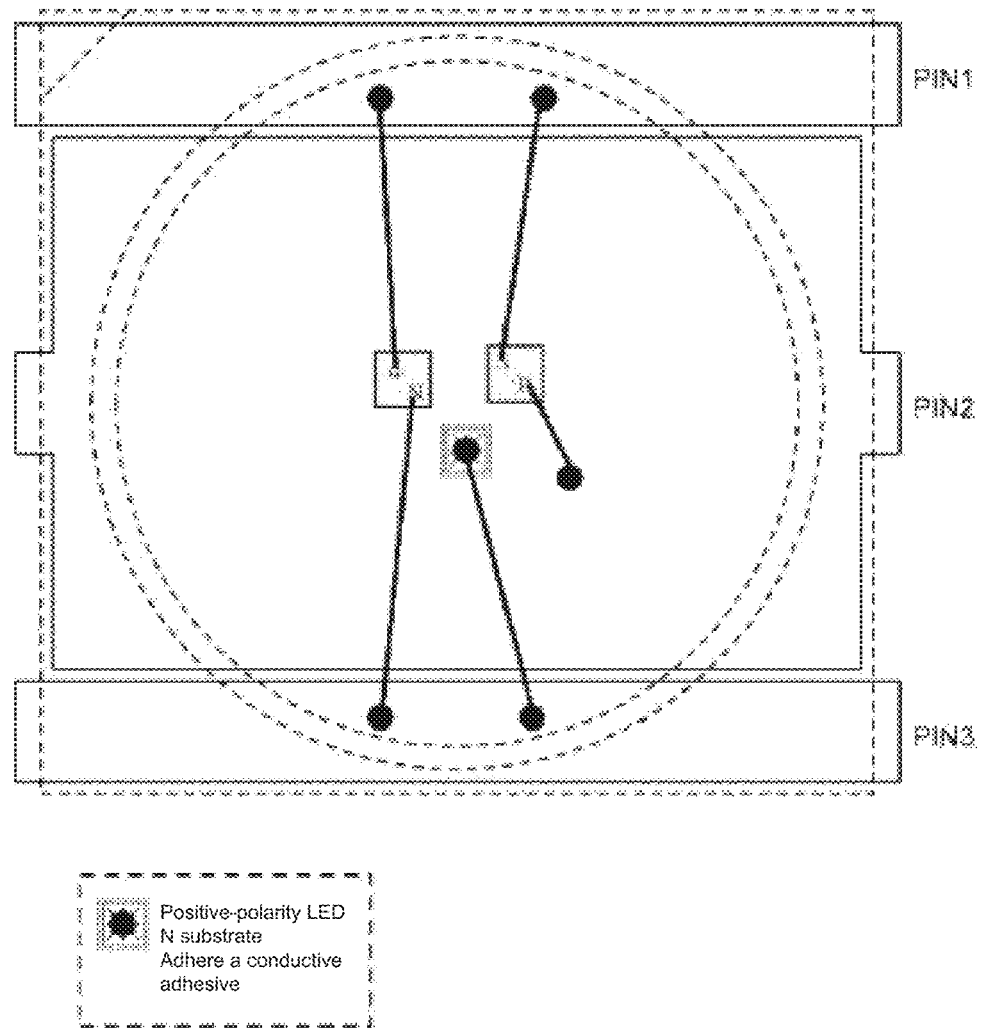
FIG. 5a is a bonding diagram of a ring-shaped lamp in SMD according to an embodiment of the present disclosure.

FIG. 5a is a bonding diagram (or a top view) of an SMD ring-shaped LED encapsulated lamp. The unipolar LED chip on the LED bracket PIN2 has positive polarity, and the substrate thereof is N pole and is connected to the LED bracket PIN2 by using the conductive adhesive. In another embodiment not shown in the drawing, the unipolar LED chip on the LED bracket PIN2 can also have reverse polarity, and the substrate thereof is a P pole and is connected to the LED bracket PIN2 by using the conductive adhesive, and the N pole thereof is connected to the P poles of other LED chips.

Figure 5B:
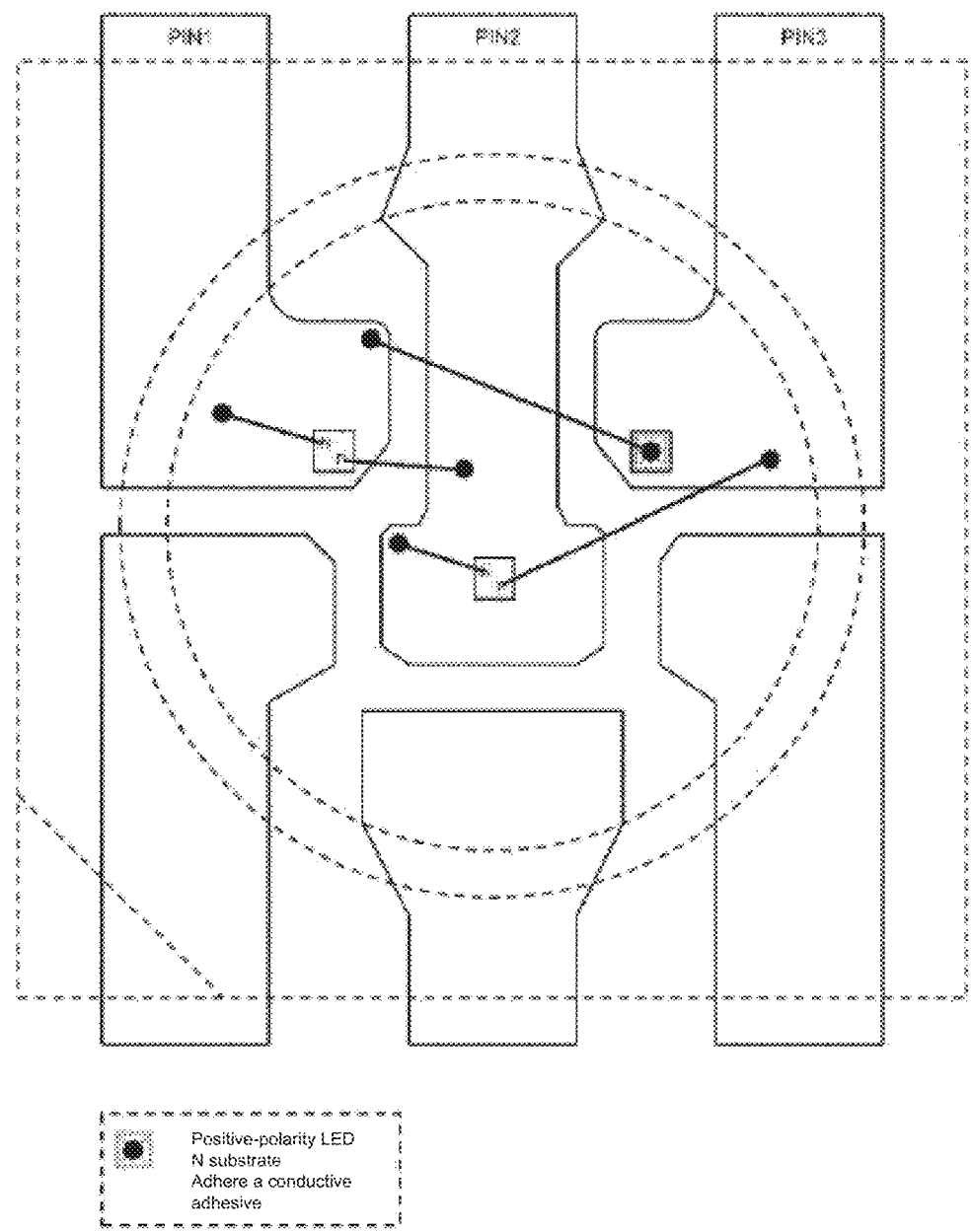
FIG. 5b is a bonding diagram of a ring-shaped lamp in SMD according to another embodiment of the present disclosure.

FIG. 5b is a bonding diagram (or a top view) of an SMD ring-shaped LED encapsulated lamp. The substrate of the positive-polarity LED chip on the LED bracket PIN3 is N pole and is connected to the LED bracket PIN3 by using the conductive adhesive. In another embodiment not shown in the drawing, the unipolar LED chip on the PIN3 can also have reverse polarity, and the substrate thereof is a P pole and is connected to the PIN3 by using the conductive adhesive, and the N pole thereof is connected to the P poles of other LED chips.

Figure 5C:
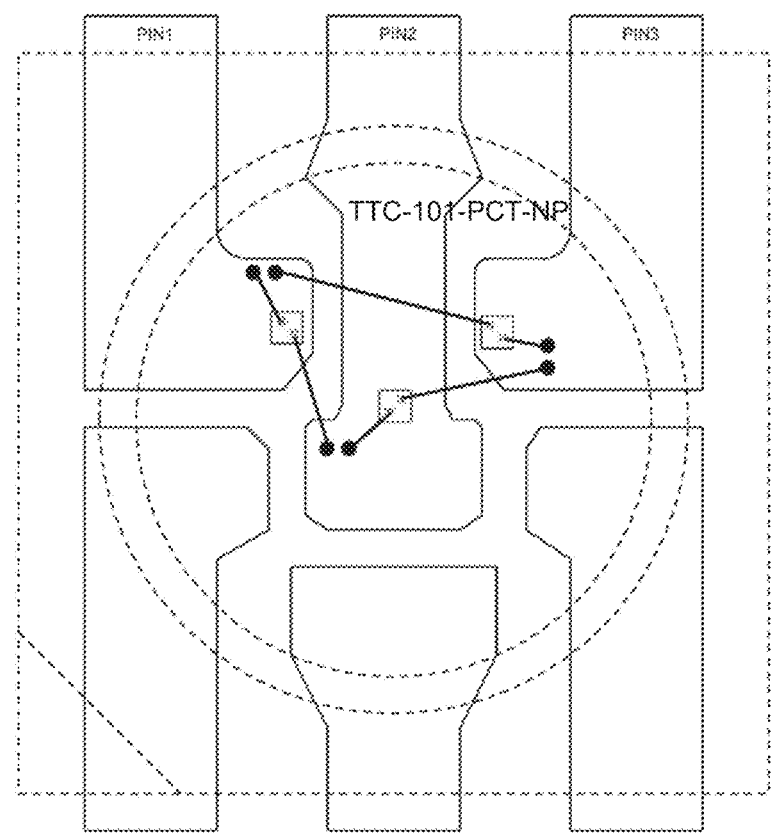
FIG. 5c is a bonding diagram of a ring-shaped lamp in SMD according to yet another embodiment of the present disclosure.

FIG. 5c is a bonding diagram of an SMD ring-shaped LED encapsulated lamp. In this embodiment, three LED chips are bipolar. The drawing shows the ring-shaped bonding path.

Figure 5D:
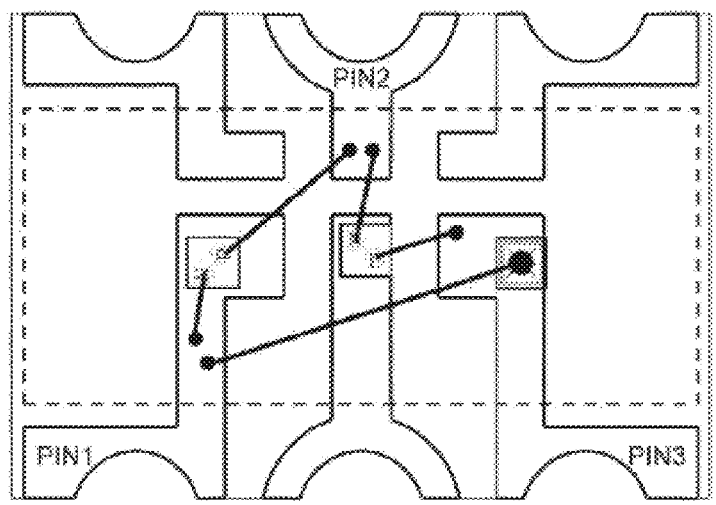
FIG. 5d is a bonding diagram of a ring-shaped lamp in COB according to an embodiment of the present disclosure.
Figure 5D:
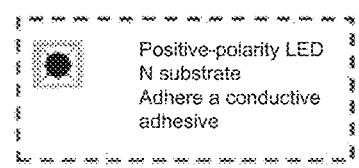

FIG. 5d is a bonding diagram of a ring-shaped COB lamp. The unipolar LED chip on the PIN3 has positive polarity, and the substrate thereof is N pole and is connected to the PIN3 by using the conductive adhesive. In another embodiment not shown in the drawing, the unipolar LED chip on the PIN3 can also have reverse polarity, and the substrate thereof is a P pole and is connected to the PIN3 by using the conductive adhesive, and the N pole thereof is connected to the P poles of other LED chips.

Figure 5E:
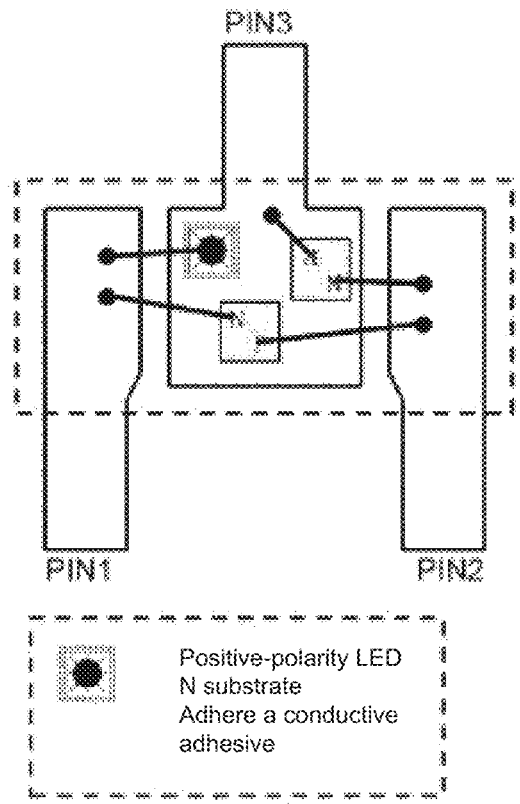
FIG. 5e is a bonding diagram of a ring-shaped lamp in SOT-23 according to an embodiment of the present disclosure.

FIG. 5e is a bonding diagram of an SOT-23 ring-shaped LED lamp. The unipolar LED chip on the PIN3 has positive polarity, and the substrate thereof is N pole and is connected to the PIN3 by using the conductive adhesive. The remaining LED chips (which can be bipolar LED chips) are also adhered and fixed to the PIN3. In another embodiment not shown in the drawing, the unipolar LED chip on the PIN3 can also have reverse polarity, and the substrate thereof is a P pole and is connected to the PIN3 by using the conductive adhesive, and the N pole thereof is connected to the P poles of other LED chips.

Figure 5F:
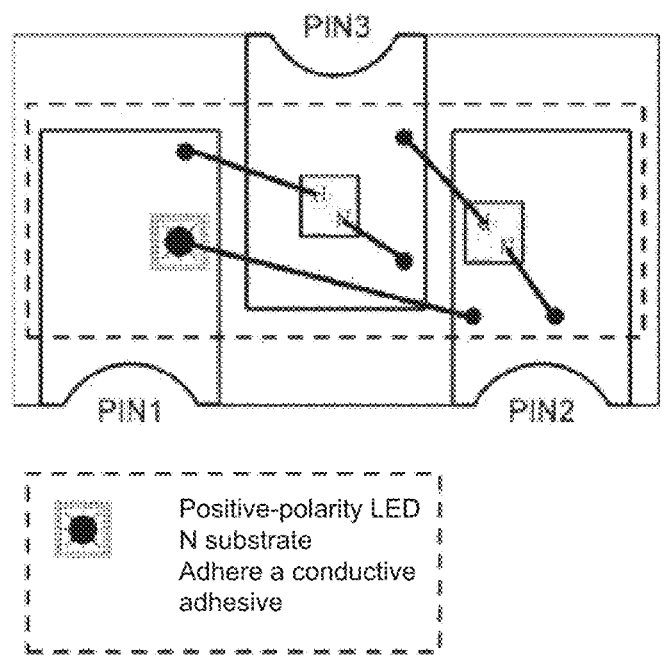
FIG. 5f is a bonding diagram of a ring-shaped lamp in COB according to another embodiment of the present disclosure.

FIG. 5f is a bonding diagram of a COB ring-shaped lamp. The unipolar LED chip on the PIN1 has positive polarity, and the substrate thereof is N pole and is connected to the PIN1 by using the conductive adhesive. In another embodiment not shown in the drawing, the unipolar LED chip on the PIN1 can also have reverse polarity, and the substrate thereof is a P pole and is connected to the PIN1 by using the conductive adhesive, and the N pole thereof is connected to the P poles of other LED chips.

Figure 6A:
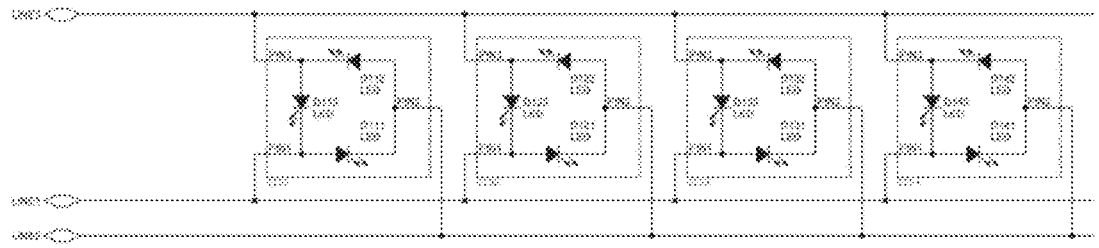
FIGS. 6a-6c are schematic diagrams of a lamp string according to embodiments of the present disclosure.
Figure 7A:
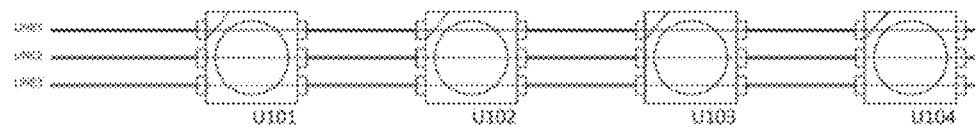
FIGS. 7a-7c are connection diagrams of the SMD lamps of the strings in FIGS. 6a-6c.

FIG. 6a and FIG. 7a are a schematic diagram and a bonding diagram of a three-wire parallel LED lamp string formed by soldering a ring-shaped LED lamp pin and three metal lines by means of soldering tin/a solder paste according to the present disclosure. As shown in FIG. 6a, the LED chips D111, D121, D131, and D141 are connected in parallel. The LED chips D112, D122, D132, and D142 are connected in parallel. The LED chips D113, D123, D133, and D143 are connected in parallel, and so on. As shown in FIG. 7a, the ring-shaped LED lamps U101, U102, U103, and U104 are connected in parallel.

The three-wire parallel LED lamp string can be turned on according to truth tables T1 and T2. For example, the control circuit can independently turns on a certain LED chip of specified color in the ring-shaped LED lamp/string by only requiring a two-state output (H/L) signal. The three-pin three-color LED lamp of the prior art can achieve an equivalent flash effect by using a control circuit with a three-state output (H/L/Z) signal.

In addition, the control circuit only requires a two-state output (H/L) and a group of PWM signals, so that two LED chips in each ring-shaped lamp can produce the visual effect of mixed light.

The metal lines LINE1-LINE3 are conventionally selected from copper lines, or from enameled lines, aluminum lines, iron lines, alloy lines, single-core lines/multi-core lines or printed circuit boards. If an insulating layer or dirt exists on the surface of the metal line, the insulating layer and dirt on the surface of the metal line where soldering is to be carried out should be removed before the soldering process. The insulating layer can be shaved by high temperature or a laser burning or scraping method.

In FIG. 7a of the embodiment of the three-wire parallel LED lamp string, the ring-shaped LED lamp is on the top, and the metal line is on the bottom (the part covered by the ring-shaped LED lamp is marked by the dotted line). During the actual product operation, the connection direction of the ring-shaped LED lamp and the metal line can be adjusted according to actual needs. According to the main point of this embodiment, the number of the ring-shaped LED lamps can be reduced or continued to be expanded/increased according to actual application requirements.

Figure 6B:
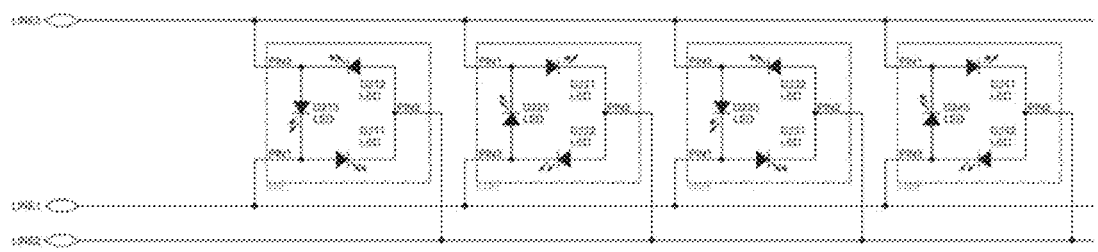
Figure 7B:
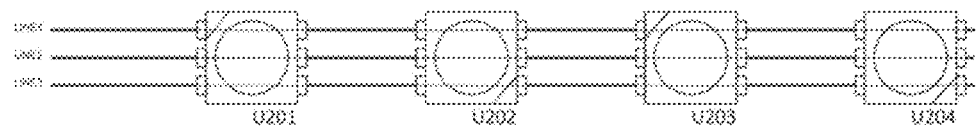

FIG. 6b and FIG. 7b are a schematic diagram and a bonding diagram of a three-wire LED lamp string formed by soldering a ring-shaped LED lamp pin and three metal lines by means of soldering tin/a solder paste according to the present disclosure. As shown in FIG. 6b, the LED chips D211 and D231 are connected in parallel. The LED chips D221 and D241 are connected in parallel. The LED chips D212 and D232 are connected in parallel. The LED chips D222 and D242 are connected in parallel. The LED chips D213 and D233 are connected in parallel. The LED chips D223 and D243 are connected in parallel, and so on. As shown in FIG. 7b, the ring-shaped LED lamps U201 and U203 are connected in parallel. The ring-shaped LED lamps U202 and U204 are connected in parallel, and are placed in opposite directions with the ring-shaped LED lamps U201 and U203.

Truth table T3

| LINE | LED | | | | | |
| --- | --- | --- | --- | --- | --- | --- |
| | D211 D231 | D212 D232 | D213 D233 | D221 D241 | D222 D242 | D223 D243 |
| LINE1 | H | Z | L | Z | L | H |
| LINE2 | L | H | Z | L | H | Z |
| LINE3 | Z | L | H | H | Z | L |

H: high level voltage.
L: low level voltage.
Z: the floating state or a voltage between a high level voltage and a low level voltage.

Truth table T4a

| LINE | LED | | |
| --- | --- | --- | --- |
| | D213 D222 D233 D242 | D211 D221 D231 D241 | D212 D223 D232 D243 |
| LINE1 | L | H | H |
| LINE2 | H | L | H |
| LINE3 | H | H | L |

H: high level voltage.
L: low level voltage.

Truth table T4b

| LINE | LED | | |
| --- | --- | --- | --- |
| | D211 D223 D231 D243 | D212 D222 D232 D242 | D213 D221 D233 D241 |
| LINE1 | H | L | L |
| LINE2 | L | H | L |
| LINE3 | L | L | H |

H: high level voltage.
L: low level voltage.

The turn-on operation is performed on the three-wire LED lamp string according to truth table T3 or truth table T4a or T4b. Three states are quickly cycled to turn on the LED chips on the lamp string respectively to form the visual effect that all LED chips on the lamp string are turned on together. In addition, the ring-shaped LED lamps are placed alternately and are connected to three wires in parallel to form the LED lamp string (the three-wire parallel connection method is shown in FIG. 7b), the LED lamp string can realize the flash effects such as colorful mixed light/synchronous flash/mixed light gradual change/wave flash/jump/sharp-flash/bounce flash/interactive flash/flash with the music, but the control circuit needs to have a three-state output (H/L/Z) signal.

In FIG. 7b of the embodiment of the three-wire LED lamp string, the ring-shaped LED lamp is on the top and the metal line is on the bottom (the part covered by the ring-shaped LED lamp is marked by the dotted line). During the actual product operation, the connection direction of the ring-shaped LED lamp and the metal line can be adjusted according to actual needs. According to the main point of this embodiment, the number of the ring-shaped LED lamps can be reduced or continued to be expanded/increased according to actual requirements.

Figure 6C:
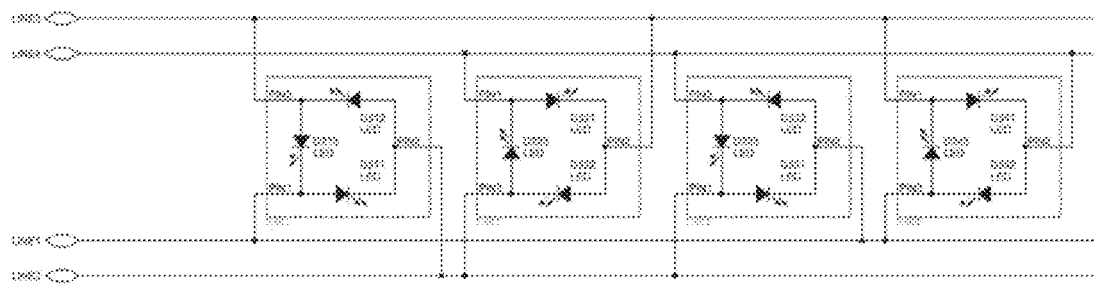
Figure 7C:
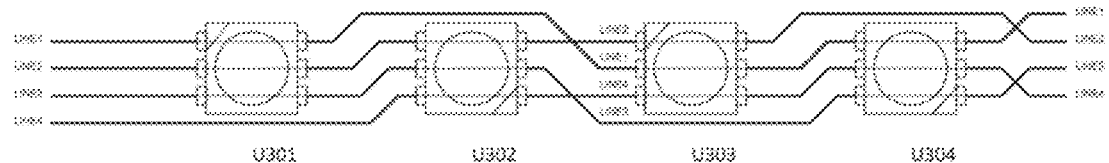

FIG. 6c and FIG. 7c are a schematic diagram and a bonding diagram of a four-wire LED lamp string formed by soldering the ring-shaped LED lamp pin and four metal lines by means of soldering tin/a solder paste according to the present disclosure.

In FIG. 7c of the embodiment of the four-wire LED lamp string, the ring-shaped LED lamp is on the top, and the metal line is on the bottom (the part covered by the ring-shaped LED lamp is marked by the dotted line). During the actual product operation, the connection direction of the ring-shaped LED lamp and the metal line can be adjusted according to actual needs. According to the main point of this embodiment, the number of the ring-shaped LED lamps can be continued to be expanded/increased according to actual requirements.

Truth table T5

| LINE | LED | | | | | | | | | | | |
| --- | --- | --- | --- | --- | --- | --- | --- | --- | --- | --- | --- | --- |
| | D311 | D312 | D313 | D321 | D322 | D323 | D331 | D332 | D333 | D341 | D342 | D343 |
| LINE1 | H | Z | L | Z | Z | Z | L | H | Z | Z | L | H |
| LINE2 | L | H | Z | Z | L | H | H | Z | L | Z | Z | Z |
| LINE3 | Z | L | H | L | H | Z | Z | Z | Z | H | Z | L |
| LINE4 | Z | Z | Z | H | Z | L | Z | L | H | L | H | Z |

H: high level voltage.
L: low level voltage.
Z: the floating state or a voltage level voltage between a high level voltage and a low level voltage.

| | Truth table T6a | | | |
|---|---|---|---|---|
| | LED | | | |
| LINE | D313 D331 D342 | D311 D322 D333 | D312 D321 D343 | D323 D332 D341 |
| LINE 1 | L | H | H | H |
| LINE 2 | H | L | H | H |
| LINE 3 | H | H | L | H |
| LINE 4 | H | H | H | L |

H: high level voltage.
L: low level voltage.

| | Truth table T6b | | | |
|---|---|---|---|---|
| | LED | | | |
| LINE | D311 D332 D343 | D312 D323 D331 | D313 D22 D341 | D321 D333 D342 |
| LINE 1 | H | L | L | L |
| LINE 2 | L | H | L | L |
| LINE 3 | L | L | H | L |
| LINE 4 | L | L | L | H |

H: high level voltage.
L: low level voltage.

The turn-on operation is performed on the four-wire LED lamp string according to truth table T5 or truth table T6a or T6b. Four states are quickly cycled to turn on the LED chips on the lamp string respectively to form the visual effect that all LED chips on the lamp string are turned on together. In addition, the ring-shaped LED lamps are placed alternately and are interactively connected to four wires to form the LED lamp string (the four-wire connection method is shown in FIG. 7c), the LED lamp string can realize the flash effects such as colorful mixed light/synchronous flash/mixed light gradual change/wave flash/jump/sharp-flash/bounce flash/interactive flash/horse race flash/meteor flash/flash with the music, where the control circuit needs to have a three-state output (H/L/Z) signal.

In some embodiments, the number of wires of the LED lamp string is not limited to 3 or 4, and can also be recursed in the following manner. Assuming that the number of wires of the LED lamp string is N, the number of independently controlled LED chips is calculated as $N*(N-1)$. For example, three wires can independently control $3*2=6$ LED chips, and since 6 can be exactly divided by 3 (ring-shaped lamps of three LED chips), two ring-shaped LED lamps can be connected. Four wires can independently control $4*3=12$ LED chips, and since 12 can be exactly divided by 3, four ring-shaped LED lamps can be connected. Five wires can independently control $5*4=20$ LED chips, and since 20 cannot be exactly divided by 3, it is not illustrated. However, the product application such as the meteor lamp, for example, can use nine wires ($9*8=72$ LED chips can be independently controlled), and since 72 can be exactly divided by 3, 24 ring-shaped LED lamps can be connected.

Figure 8:
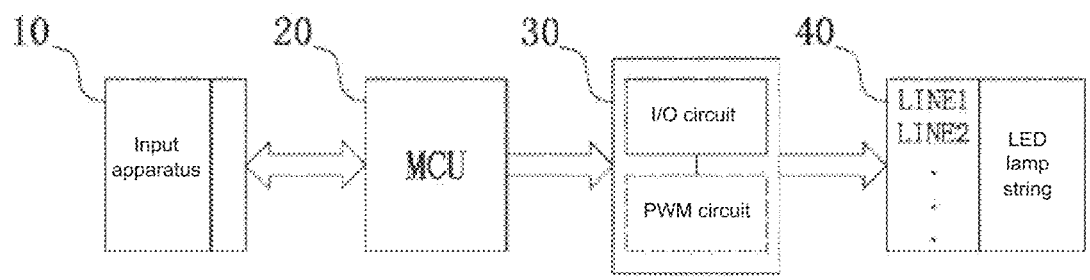
FIG. 8 is a schematic block diagram of a lamp string control circuit according to an embodiment of the present disclosure.

Referring to FIG. 8, a control circuit of the lamp string according to the present disclosure includes an input device 10, a microprocessor 20, an output circuit 30, and a lamp string interface 40. The microprocessor 20 receives a signal from the input device, and sends an I/O signal or PWM signal to the output circuit 30 to trigger a level voltage change of the lamp string interface 40. Specifically, the control circuit can include an MCU single-chip microcomputer, a memory, such as a hard disk, an optical reading and/or writing storage medium, a RAM, and a ROM for storing the above-mentioned truth tables and control program codes (or machine readable codes). The microprocessor 20 executes the code, and then triggers the transmission of an I/O signal or PWM signal to the output circuit 30 so that the illumination performance of the lamp string can be exhibited according to a predetermined procedure.

Figure 11:
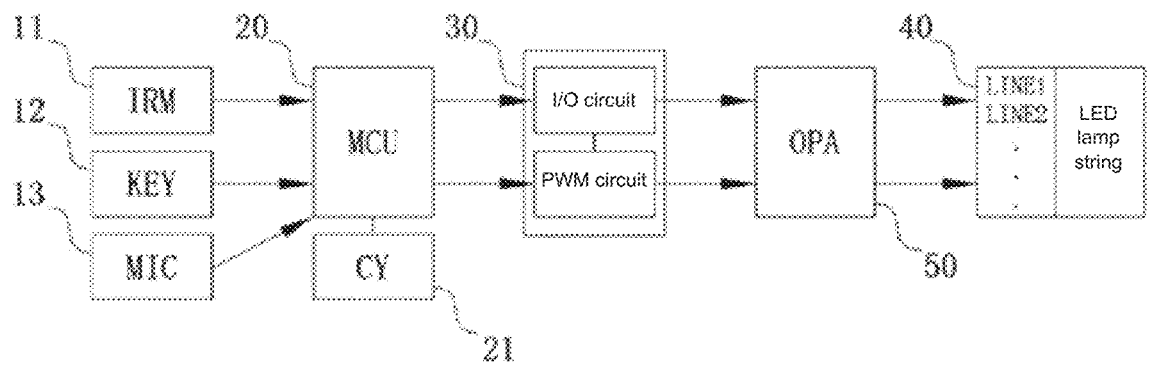
FIG. 11 is a schematic block diagram of a lamp string control circuit according to a preferred embodiment of the present disclosure.

Referring to FIG. 11, the input device can include a Radio Frequency (RF)/Infrared-Receiver-Module (IRM) 11, a touch key/physical button 12 or a microphone 13, and the like. The microprocessor 20 can also be connected to an external crystal oscillator 21. The output circuit 30 includes an I/O circuit and/or a PWM circuit. A voltage follower circuit 50 can also be connected between the output circuit 30 and the lamp string interface 40.

The control circuit of the lamp string according to the present disclosure will be described below by a plurality of examples.

Figure 9:
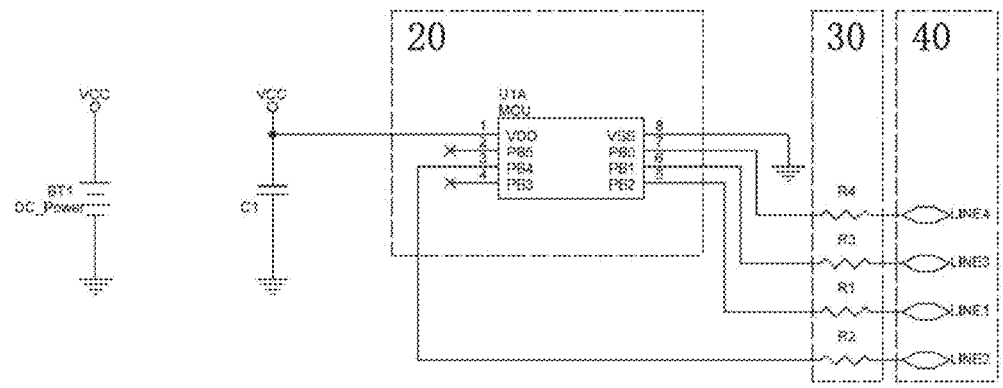
FIG. 9 shows a lamp string control circuit according to an embodiment of the present disclosure.

FIG. 9 is an example of a schematic diagram of a main control board of a four-wire LED lamp string. The ring-shaped LED lamp/string is directly driven by the I/O port of the MCU single-chip microcomputer. In the drawing, resistors R1, R2, R3, and M are series-connected current-limiting resistors of the lamp string. The circuit in this embodiment can also be applied to other lamp strings of fewer wires.

Figure 10:
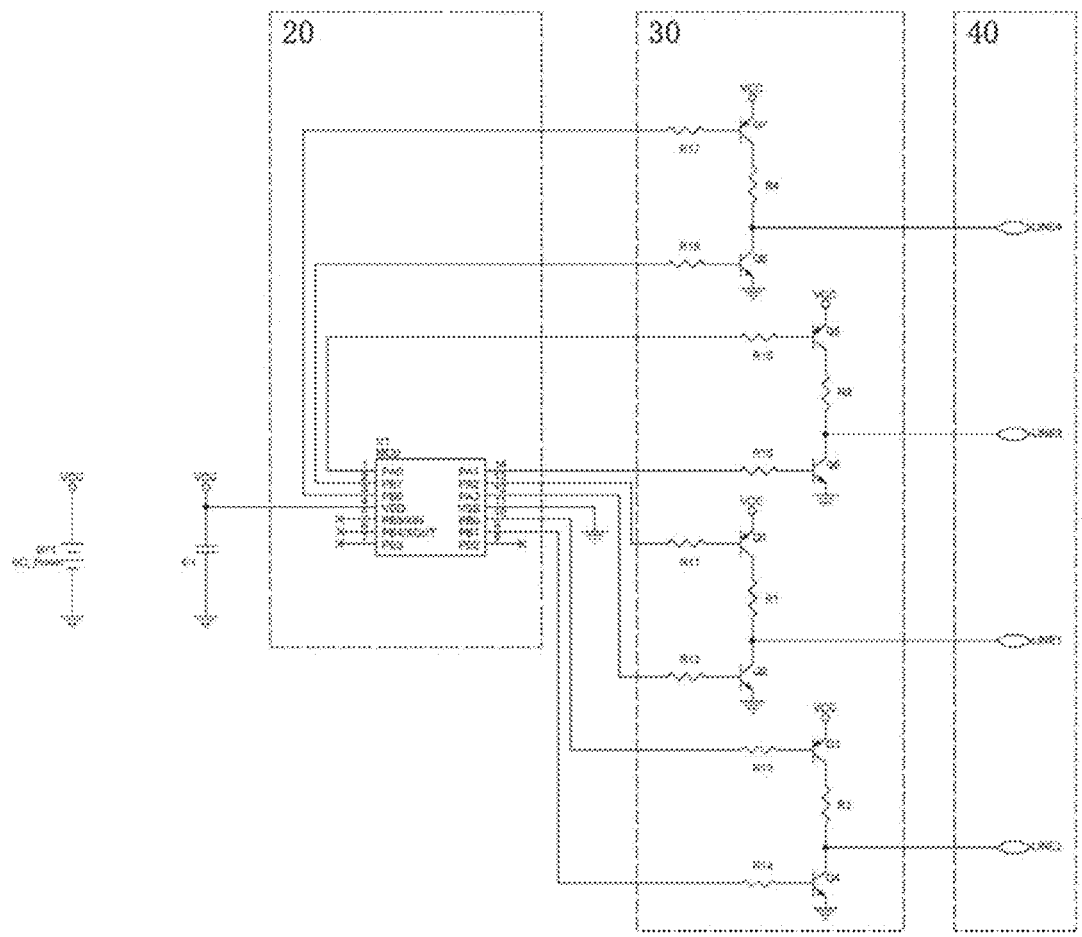
FIG. 10 shows a lamp string control circuit according to another embodiment of the present disclosure.

FIG. 10 is an example of a schematic diagram of a main control board of a four-wire LED lamp string. The resistors R1, R2, R3, and M are series-connected current-limiting resistors of the lamp string for preventing the main control board from outputting excessive current to burn the ring-shaped LED lamp. As shown in FIG. 10, triodes (such as triodes Q1 and Q2) on the same branch form a switching circuit group of the H/L/Z three-state output. It is also possible to modify the circuit shown in FIG. 10 for driving the three-wire ring-shaped LED lamp/string, such as removing resistors R4, R17, and R18 and triodes Q7 and Q8.

Figure 12:
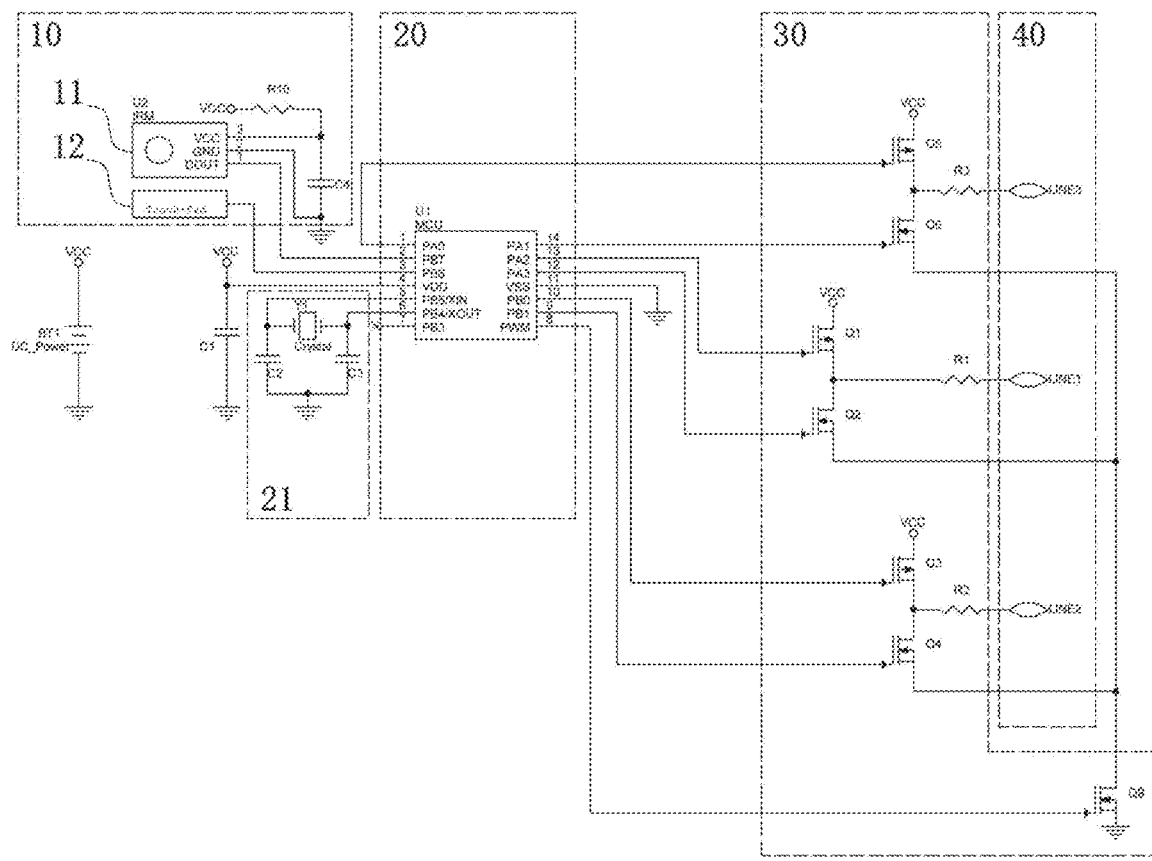
FIG. 12 shows a lamp string control circuit according to a preferred embodiment of the present disclosure.
Figure 13:
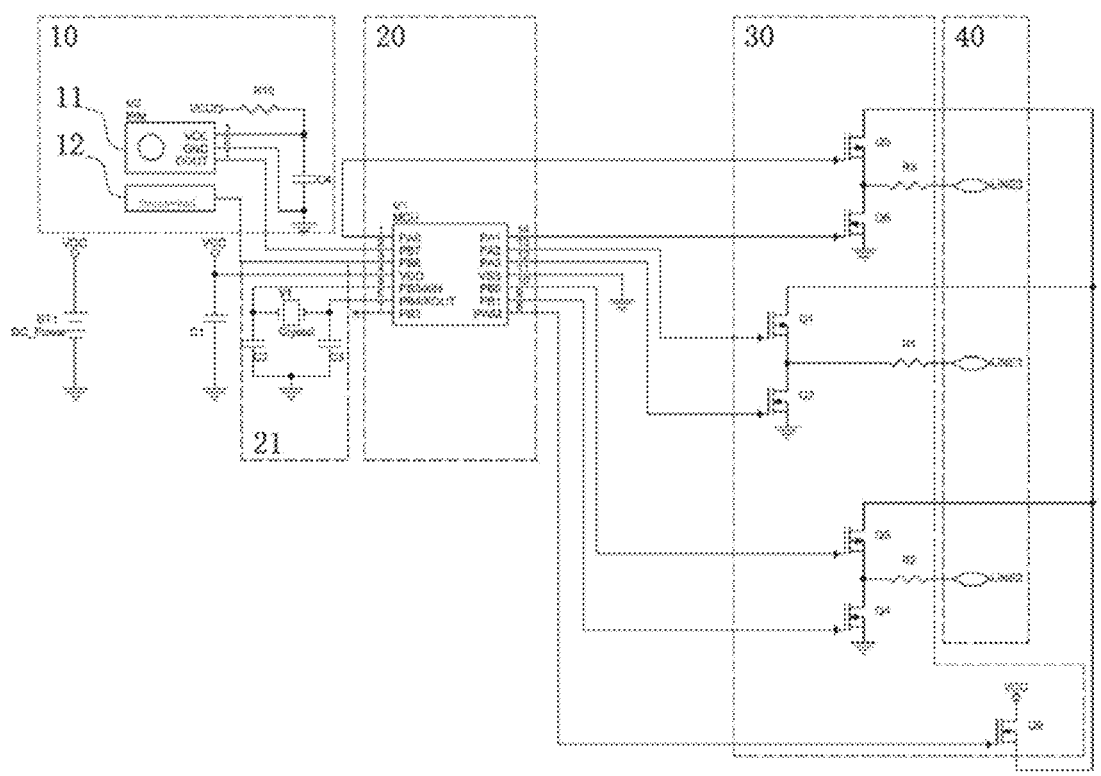
FIG. 13 shows a lamp string control circuit according to another preferred embodiment of the present disclosure.
Figure 15:
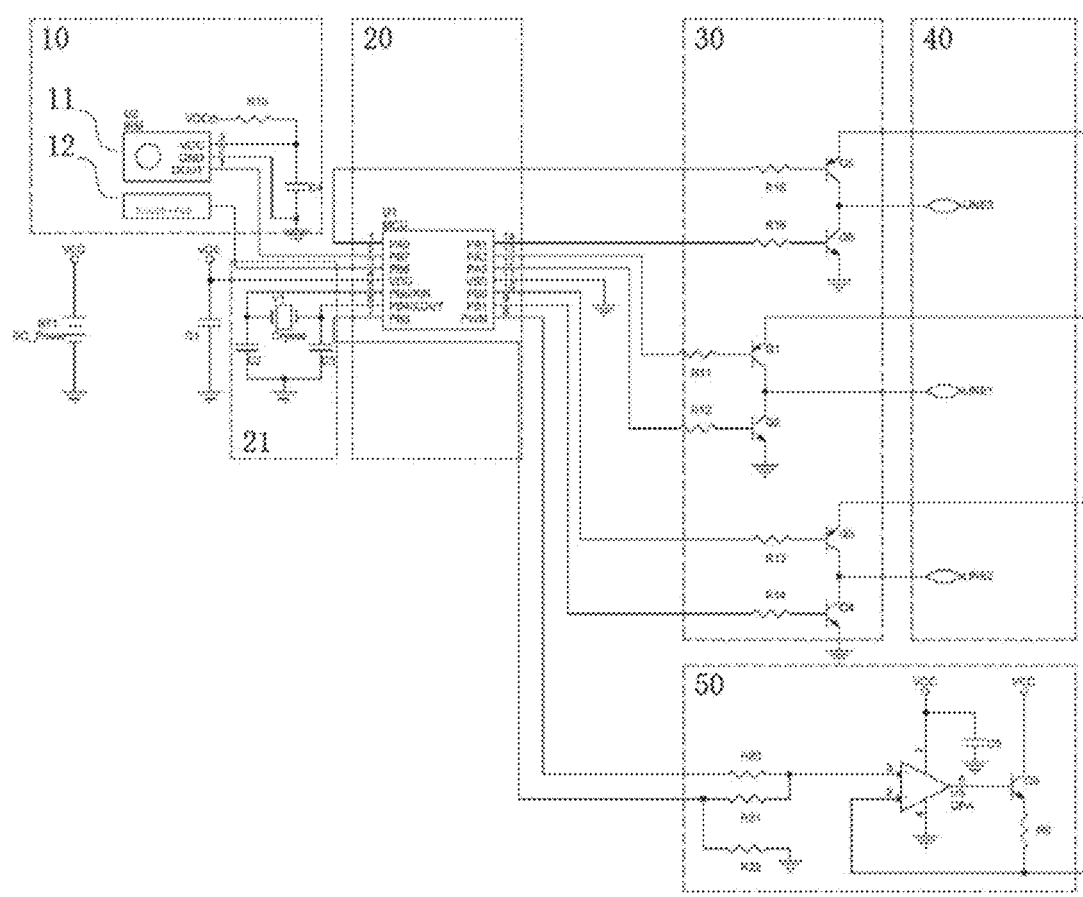
FIG. 15 shows a lamp string control circuit according to yet another preferred embodiment of the present disclosure.

FIG. 12 is an example of a schematic diagram of a main control board of the three-wire LED lamp string. The resistors R1, R2, and R3 are series-connected current-limiting resistors of the lamp string for preventing the main control board from outputting excessive current to burn the ring-shaped LED lamp. As shown in FIG. 12, MOS transistors (such as MOS transistors Q1 and Q2) on the same branch form a switching circuit group of the H/L/Z three-state output. The MOS transistor adopted in this embodiment removes the series-connected resistor required in the triode solution, saves space, and can also be applicable to application scenarios of higher power. The touch key 12 can be increased according to the requirements of actual product application, so as to receive external control and switch the flash mode. The microphone (not shown in the figure) can be increased according to the requirements of actual product application, so as to receive external control and change the flash mode with the music. The crystal oscillator 21 can be increased according to the requirements of actual product application to improve the accuracy of timing. The RF/IRM 11 can be increased according to the requirements of actual product application, so as to receive external control, change the flash mode, set the work schedule and other application requirements. Sources of the MOS transistors Q2, Q4, and Q6 can be connected to a drain of the MOS transistor Q9 according to requirements of the actual product application, so that the MOS transistor Q9 functions as a main switch. The ring-shaped LED lamp/string can be driven by means of a PWM output pin of a main control terminal. The MOS transistor Q9 can also be configured to control the sources of the MOS transistors Q1, Q3, and Q5, as shown in FIG. 13. A conventional voltage follower circuit is formed by an Operation Amplifier (OPA) 50, the triode Q9, and the resistor R9 according to requirements of the actual product application, and achieves accurate regulation of voltage values of wires LINE1-LINE3 by means of a PWM/DAC output pin of the main control terminal to drive the ring-shaped LED lamp/string, as shown in FIG. 15.

Figure 14:
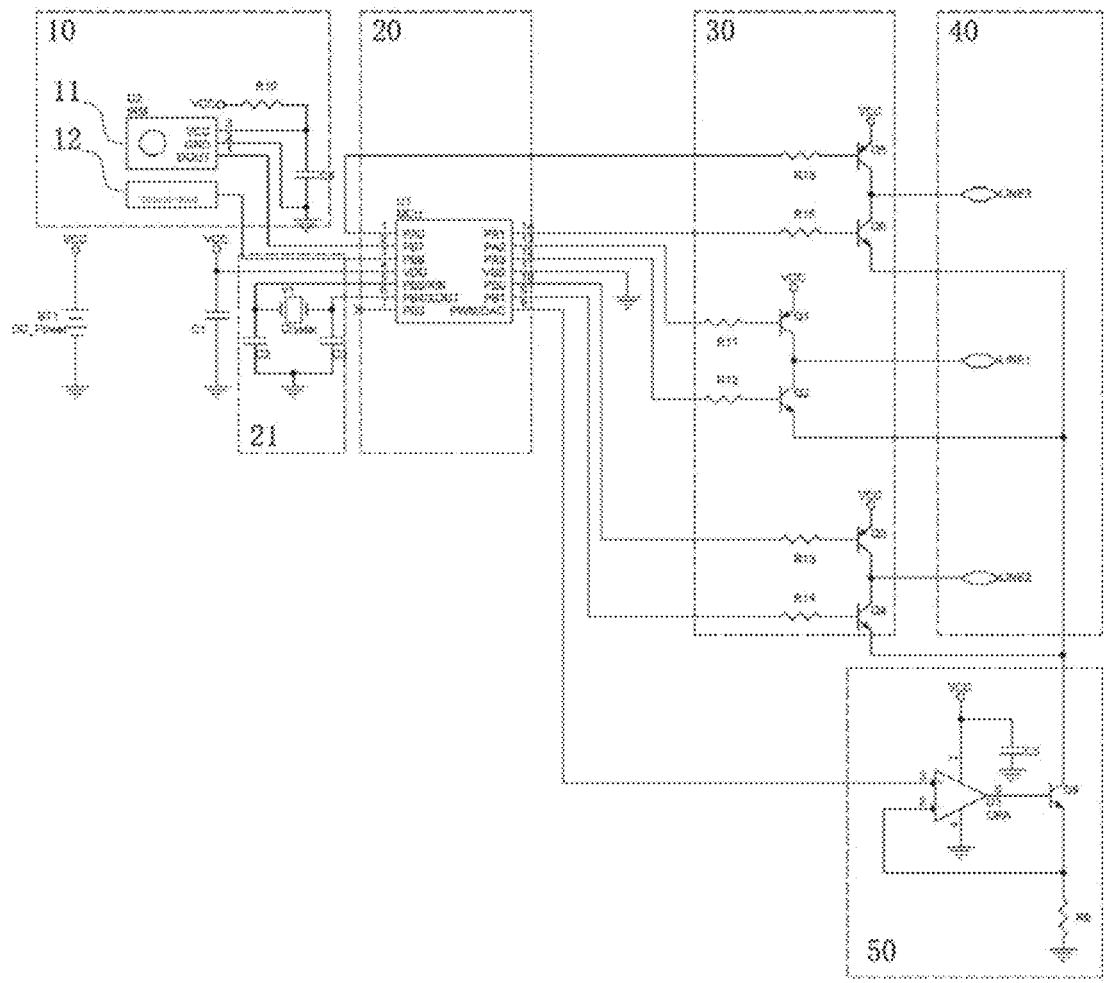
FIG. 14 shows a lamp string control circuit according to yet another preferred embodiment of the present disclosure.

FIG. 14 is an example of a schematic diagram of a main control board of the three-wire LED lamp string. Triodes (such as triodes Q1 and Q2) on the same branch form a switching circuit group of the H/L/Z three-state output. In this embodiment, the conventional voltage follower circuit is formed by the OPA 50, the triode Q9, and the resistor R9, and achieves accurate regulation of the value of the current (flowing through the resistor R9) of the wires LINE1-LINE3 by means of the PWM/DAC output pin of the main control terminal, so as to drive the ring-shaped LED lamp/string.

The invention claimed is:

1. A ring-shaped lamp, comprising:
   a package body;
   three or more LED chips; and
   electrically conductive pins partially located within the package body, a minimum number of the electrically conductive pins being the same as the number of LED chips,
   wherein, in the package body, the three or more LED chips are sequentially connected in a ring shape such that a P pole of each LED chip of the three or more LED chips is simultaneously connected to an N pole of another LED chip and to one pin of the electrically conductive pins.

2. The ring-shaped lamp according to claim 1, wherein the number of the LED chips is three, and wherein:
   a P pole of a first LED chip is connected to a first pin by wire bonding or conductive adhesive, and an N pole of a third LED chip is connected to the first pin by wire bonding or the conductive adhesive;
   a P pole of a second LED chip is connected to a second pin by wire bonding or the conductive adhesive, and an N pole of the first LED chip is connected to the second pin by wire bonding or the conductive adhesive; and
   a P pole of the third LED chip is connected to a third pin by wire bonding or conductive adhesive, and an N pole of the second LED chip is connected to the third pin by wire bonding or the conductive adhesive.

3. The ring-shaped lamp according to claim 2, wherein the LED chip comprises a bipolar LED chip and a unipolar LED chip, and wherein:
   one or more bipolar LED chips are adhered and fixed on the same pin.

4. The ring-shaped lamp according to claim 2, wherein the LED chip comprises a bipolar LED chip and a unipolar LED chip, and wherein:
   one unipolar LED chip or two unipolar LED chips of different substrate polarities are adhered and fixed on the same pin by means of the conductive adhesive.

5. The ring-shaped lamp according to claim 1, wherein the LED chip comprises a bipolar LED chip and a unipolar LED chip, and wherein:
   one or more bipolar LED chips are adhered and fixed on a same pin.

6. The ring-shaped lamp according to claim 1, wherein the LED chip comprises a bipolar LED chip and a unipolar LED chip, and wherein:
   one unipolar LED chip or two unipolar LED chips of different substrate polarities are adhered and fixed on a same pin by means of the conductive adhesive.

7. The ring-shaped lamp according to claim 1, wherein the LED chip comprises a bipolar LED chip and a unipolar LED chip, and wherein:
   one or more bipolar LED chips are adhered and fixed on a same pin; and
   one unipolar LED chip or two unipolar LED chips of different substrate polarities are adhered and fixed on the same pin by means of the conductive adhesive.

8. The ring-shaped lamp according to claim 1, wherein a package mode of the package body comprises a DIP, SMD, SOT, or COB.

9. A lamp string, comprising at least one group of lamps and a plurality of electrically conductive wires connected to the multiple lamps, each group of lamps comprising a plurality of ring-shaped lamps, each ring-shaped lamp comprising:
   a package body;
   three or more LED chips; and
   electrically conductive pins partially located within the package body, minimum number of the electrically conductive pins being the same as the number of LED chips,
   wherein, in the package body, the three or more LED chips are sequentially connected in a ring shape such that a P pole of each LED chip of the three or more LED chips is simultaneously connected to an N pole of another LED chip and to one pin of the electrically conductive pins.

10. The lamp string according to claim 9, wherein the electrically conductive pins of some or all of the ring-shaped lamps in each group of lamps are connected in parallel, with the parallel electrically conductive pins connected to one wire.

11. The lamp string according to claim 9, wherein the number of LED chips of each ring-shaped lamp is three, and the number of wires is three, and wherein the first pins of all the lamps are connected to a first wire, the second pins of all the lamps are connected to a second wire, and the third pins of all the lamps are connected to a third wire.

12. The lamp string according to claim 9, wherein each group of lamps comprises two ring-shaped lamps, the number of LED chips of each ring-shaped lamp is three, and the number of wires is three, and wherein, in each group of lamps:
   a first pin of a first lamp and a third pin of a second lamp are connected to the first wire, respectively;
   second pins of the first lamp and the second lamp are connected to the second wire; and
   a third pin of the first lamp and a first pin of the second lamp are connected to the third wire, respectively.

13. The lamp string according to claim 9, wherein each group of lamps comprises four ring-shaped lamps, the number of LED chips of each ring-shaped lamp is three, and the number of wires is four; in each group of lamps:
   a first pin of a first lamp, a second pin of a third lamp, and a third pin of a fourth lamp are connected to the first wire;
   a second pin of the first lamp, a third pin of the second lamp, and a first pin of the third lamp are connected to the second pin;
   a third pin of the first lamp, a second pin of the second lamp, and a first pin of the fourth lamp are connected to the third wire; and a first pin of the second lamp, a third pin of the third lamp, and a second pin of the fourth lamp are connected to the fourth wire.

14. A lamp string system, comprising a control circuit, and at least one lamp string comprising at least one group of lamps and an electrically conductive wire connected to the multiple lamps, each group of lamps comprising a plurality of ring-shaped lamps, each ring-shaped lamp comprising:

a package body;

three or more LED chips; and electrically conductive pins partially located within the package body, a minimum number of the electrically conductive pins being the same as the number of LED chips, wherein, in the package body, the three or more LED chips are sequentially connected in a ring shape such that a P pole of each LED chip of the three or more LED chips is simultaneously connected to an N pole of another LED chip and to one pin of the electrically conductive pins.

15. The lamp string system according to claim 14, wherein the control circuit comprises an input device, an output circuit, a lamp string interface connected to the output circuit and a microprocessor configured to receive a signal from the input device and send an I/O signal or a PWM signal to the output circuit to trigger a voltage level change of the lamp string interface.

16. The lamp string system according to claim 15, wherein the microprocessor is further configured to input a PWM signal to a wire, input a high level voltage to another wire, and input a low level voltage to other wires, so that at least two LED chips in each lamp produce a visual effect of mixed light.

17. The lamp string system according to claim 15, wherein the microprocessor is further configured to input a PWM signal to a wire, input a low level voltage to another wire, and input a high level voltage to other wires, so that at least two LED chips in each lamp produce a visual effect of mixed light.

18. The lamp string system according to claim 15, wherein the output circuit comprises:

a transistor switching circuit; and/or a voltage follower circuit configured to regulate an output voltage of the transistor switching circuit.

19. The lamp string system according to claim 15, wherein the output circuit comprises a main switching circuit and a plurality of branch switching circuits, wherein the main switching circuit receives the I/O signal or PWM signal from the microprocessor to simultaneously control the plurality of branch switching circuits.

20. The lamp string system according to claim 15, wherein the input device comprises a touch key, a physical button, a microphone, a radio frequency receiver module, or an infrared receiver module.

\* \* \* \* \*